(12) United States Patent
Garnett et al.

(10) Patent No.: US 6,999,312 B1
(45) Date of Patent: Feb. 14, 2006

(54) HEATSINK APPARATUS

(75) Inventors: Paul Jeffrey Garnett, Camberley (GB); Jay Kevin Osborn, Crowthorne (GB); Andrew Stephen Burnham, Leatherhead (GB)

(73) Assignee: Sun Microsystems, Inc., Santa Clara, CA (US)

( * ) Notice: Subject to any disclaimer, the term of this patent is extended or adjusted under 35 U.S.C. 154(b) by 28 days.

(21) Appl. No.: 10/403,668

(22) Filed: Mar. 31, 2003

(51) Int. Cl.
*G06F 1/20* (2006.01)

(52) U.S. Cl. .................. 361/687; 361/695; 165/80.3

(58) Field of Classification Search ........ 361/685–687, 361/689–690, 695, 697, 796, 801; 165/80.3; 312/223.2; 364/708.1
See application file for complete search history.

(56) References Cited

U.S. PATENT DOCUMENTS

| | | | | |
|---|---|---|---|---|
| 5,446,619 A | * | 8/1995 | Madsen et al. | 361/695 |
| 5,544,012 A | * | 8/1996 | Koike | 361/695 |
| 5,852,547 A | * | 12/1998 | Kitlas et al. | 361/695 |
| 5,937,937 A | | 8/1999 | Sehmbey et al. | 165/104.33 |
| 6,130,819 A | | 10/2000 | Lofland et al. | 361/695 |
| 6,330,154 B1 | | 12/2001 | Fryers et al. | 361/695 |
| 6,367,541 B1 | | 4/2002 | McCullough | 165/80.3 |
| 6,462,948 B1 | | 10/2002 | Leija et al. | 361/697 |
| 6,556,440 B1 | * | 4/2003 | Jensen et al. | 361/687 |
| 6,661,661 B1 | | 12/2003 | Gaynes et al. | 361/705 |
| 6,691,768 B1 | | 2/2004 | Hsieh et al. | 165/80.3 |

FOREIGN PATENT DOCUMENTS

| | | |
|---|---|---|
| JP | 7321257 | 12/1995 |
| JP | 2001044674 | 2/2001 |

OTHER PUBLICATIONS

International search report application No. GB0402382.6 mailed Jun. 15, 2004.
International search report application No. GB0402382.6 mailed Nov. 19, 2004.

* cited by examiner

*Primary Examiner*—Hung Van Duong
(74) *Attorney, Agent, or Firm*—Meyertons Hood Kivlin Kowert & Goetzel, P.C.; B. Noël Kivlin

(57) ABSTRACT

There is provided a computing apparatus. The computing apparatus has first and second computing elements and a heatsink thermally coupled to each of the first and second computing elements. A portion of the heatsink thermally coupled to the first computing element is thermally separated from a portion of the heatsink thermally coupled to the second computing element by a region having a reduced thermal conductivity.

19 Claims, 4 Drawing Sheets

HEATSINK APPARATUS

BACKGROUND OF THE INVENTION

The present invention relates to heatsink apparatus, and in particular but not exclusively to ducted heatsink apparatus for computer system components.

One application for the present invention relates to high density computer systems, for example, computer server systems for telecommunications applications. In telecommunications applications, it is important to provide high reliability and high capacity of operation. Various approaches have been taken to providing such high-performance, high reliability systems. Typically such systems are designed around providing redundant resources so that if one component of the system develops a fault, the system remains operational using the redundant resources. Fault tolerance can also be achieved, for example, with multiprocessor systems that provide redundancy through dynamic, e.g., software-controlled, task distribution. High density systems are typically rack mountable, with one or more processor systems occupying a shelf in the rack. The trend in recent times is to make the computers with smaller form factors. This means that more computers can be located in a rack. This has the advantage of increasing the processing density within the racks, and also the advantage of reducing the distance between the computer systems. High density computer systems, like other computer systems, require cooling. In high density systems it may be impossible or very difficult for components to be arranged so as to provide optimum flow of cooling air to all components of a given system or system module.

The present invention relates to control of the flow of cooling air through a computer system or computer system module to facilitate efficient cooling within the system or module.

SUMMARY OF THE INVENTION

A first aspect of the present invention may provide a computing apparatus. The computing apparatus has first and second computing elements and a heatsink thermally coupled to each of the first and second computing elements. A portion of the heatsink thermally coupled to the first computing element is thermally separated from a portion of the heatsink thermally coupled to the second computing element by a region having a reduced thermal conductivity. This arrangement provides a simple and efficient system whereby each of two primary heat sources within a computing system may be provided with effective cooling.

In one embodiment, a flow of cooling air is forced between fins of the heatsink to provide further cooling. Thus a single forced airflow may be used to provide cooling to the two elements.

A second aspect of the invention may provide a computing apparatus including a housing that defines a cavity. The computer apparatus further includes within the cavity multiple computing elements and a fan for generating airflow to cool said components. The fan has a first path defining an air inflow and a second path defining an air outflow. One of the first and second paths is ducted to a vent facility in a first wall of said housing, and the other one of said first and second paths communicates with said cavity adjacent said first wall. At least two computing elements which are primary heat sources within the cavity are positioned in said first path or said second path, a heatsink is attached to said at least two computing elements and the heatsink is positioned in said first path or said second path. This arrangement provides for effective and efficient cooling of primary heat sources within a computing system by control of the airflow through the computing system to provide cooling to a combined heatsink for the heat sources.

BRIEF DESCRIPTION OF THE FIGURES

Embodiments of the present invention will be described hereinafter, by way of example only, with reference to the accompanying drawings in which like reference signs relate to like elements and in which.

Figure 1:
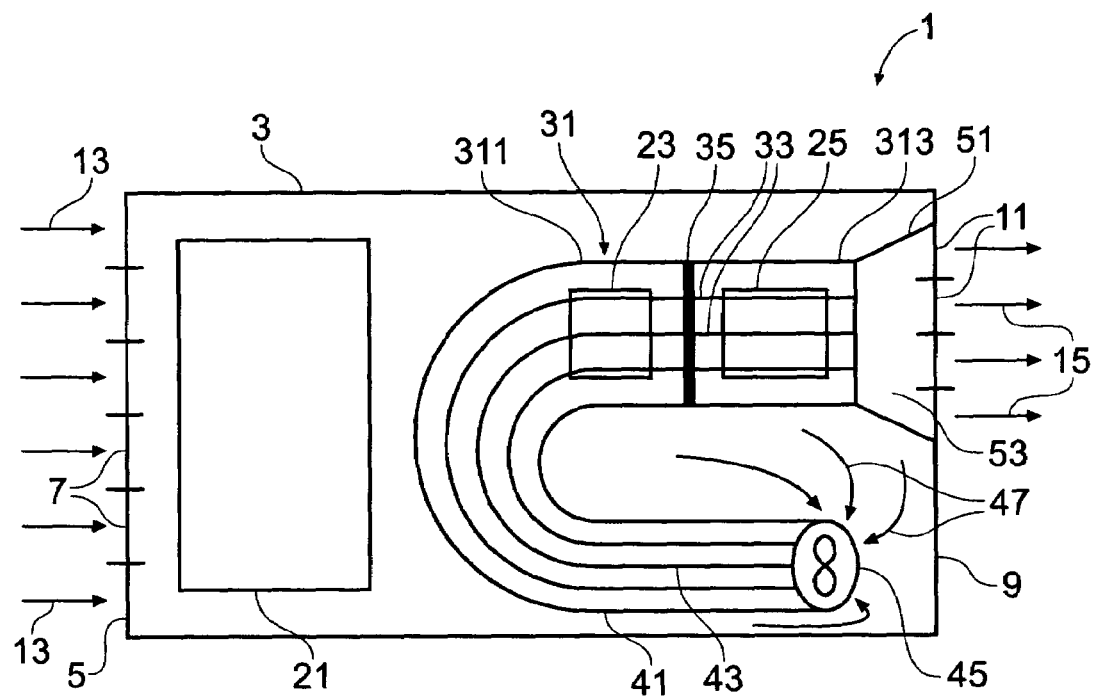
FIG. 1 shows a schematic cut-away plan view of an example of an air-cooled computer system module.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DESCRIPTION OF PARTICULAR EMBODIMENTS

Embodiments and examples are described hereafter by way of example only in the following with reference to the accompanying drawings.

FIG. 1 shows an example of an air cooled computer system module 1. The computer system module has a housing 3 which has formed through a first face 5 a plurality of air inlet vents 7. The housing 3 also has formed through a second face 9, a plurality of air outlet vents 11. Thus a flow of air for cooling the module 1 enters via the first face 5 through vents 7 (as indicated by arrows 13) and exits via the second face 9 through vents 11 (as indicated by arrows 15). In the present example the air flow is driven in a direction generally from the first face to the second face. This can be achieved by means of an optional intake duct fan 45 and/or by one or more fans external to the computer system module (possibly in another module of the computer system). The intake duct fan(s) and/or the external fan(s) can be supplemented by or replaced by direction driving fans within the computer system module if desired or required.

Within the module housing 3 are a number of computer module components. For simplicity only a small number are shown in the Figure, however, as the skilled addressee will appreciate, a very large number of small components may be required for the successful operation of a computer system, especially in a programmable computer system. In the Figure are shown a hard disk drive 21 (which may typically be the largest single component of a computer system module 1) and two integrated circuit (IC) components 23 and 25. The integrated circuit components 23 and 25 may typically be microprocessors or microcontrollers associated with processing functions of the computer system module. For example, within a computer system module having processing components based on the well-known Intel™ x86 architecture, the components 23 and 25 could be an x86 processor and a so-called "Northbridge" of the chipset associated with successful operation of the x86 processor in question. The skilled addressee will appreciate that a variety of different components may be present within a processing module and will be able to use the teachings of this example appropriately.

Each of the processing components 23 and 25 requires cooling additional to the mere passing of air across or around the component. To this end a heatsink 31 is provided to provide additional cooling to each of the processing components 23 and 25. The heatsink 31 has fins 33 to aid the transfer of heat from the heatsink to a cooling airflow.

Each of the processing components 23 and 25 may have substantial physical and operational differences to the other. For example, one may extend further from a circuit board onto which they are both mounted than the other. Also, one may require a minimum application force to be applied to a heatsink to ensure good thermal contact with the heatsink, which force may be too great for the other component to withstand. In addition, one component may have a maximum operating temperature greater or lower than the maximum operating temperature of the other. For these and other reasons, a thermal barrier 35 is provided in the heatsink 31 between a portion 311 which contacts the component 23 and a portion 313 which contacts the component 25. As will be described below with reference to FIGS. 2, 3 and 4, the thermal barrier may take many forms and may also act as a physical conditions barrier as well as a thermal barrier.

In order for air to be directed between the fins 33 to provide cooling thereto, air is fed via a duct 41. The duct 41 has a plurality of fins 43 running therethrough which fins 43 meet up with the heatsink fins 33 at a junction therebetween. In the example shown, air is forced into the duct by the intake fan 45, which draws in air from within the module housing 3 as shown by arrows 47. To ensure that the air goes where it is intended, both the duct 41 and heatsink 31 are closed above and below their respective fins 43, 33. Thus the cooling air effectively enters a multi-divided (or streamlined) tunnel at the intake fan 45 and passes through the duct and the heatsink before passing out into an exhaust area 53. The air flow path as shown curves to follow the duct, which is streamlined to minimize pressure drop between the optimum component (the chips and the fan) locations and the vent locations. The exhaust area 53 is bounded from the rest of the space within the housing 3 by dividing members 51. Air in the exhaust area then passes out of the housing 3 via the outlet vents 11. The presence of the dividing members 51 ensures that air warmed by its passage through the duct and heatsink is not returned to the flow of cooling air through the housing 3 and stops air within the housing 3 from bypassing the duct and heatsink and exiting the housing without providing cooling to the processing components 23 and 25.

The shape of the duct and the position of the duct intake are chosen in the present example to minimize the occurrence of so-called "deadzones" within the housing 3. By placing the intake as far as possible from all of the inlet vents 7, the fan 45 in the duct 41 causes a flow of cooling air from the inlet vents 7 towards the duct intake, thereby providing cooling to all components of the module 1 between the vents 7 and the duct intake.

In the present example, the duct 41 is unitary with the portion 311 of the heatsink 31 which contacts the component 23. As such the fins 41 are contiguous with the fins 31. However, the whole of the duct 41 is not necessarily an extension of the whole cross-section of the heatsink 31. The duct may have a structure whereby the entire duct 41 is formed having the same cross-section as the heatsink portion 311. Alternatively, the duct may be formed as a thin-walled air tube having no enlarged area capable of providing a heatsinking effect in the same way as heatsink portion 311. Another alternative has the heatsink gradually tapering from a full heatsink cross-section at the end joined to the heatsink portion 311 to a thin-walled air tube at the end where the intake fan 45 is mounted.

The duct 41 and heatsink 31 of the present example is formed from two pieces. One piece comprises the heatsink body, the bottom and side walls of the duct and all of the duct and heatsink fins. The second piece is a lid which comprises the top wall of the duct and of the heatsink. Each piece may be cast, forged or otherwise formed individually from metal in a conventional manner, in the same way as conventional heatsink bodies and fins may be cast. The two pieces may be connected to one another by integrated or discrete fixing members, such as resilient catches, screws and bolts. In this way, a simple construction may be utilized to provide the closed path duct and heatsink of the present example. Another example of a construction method comprises using separate duct and heatsink pieces. In this example, the duct pieces are formed separately to the heatsink pieces and are connected later.

The intake fan 45 may be moved relative to the position of the intake hole to the duct 41. The fan may be positioned anywhere between the intake to the duct 41 and the exhaust area 43 provided that it acts to force air through the duct from the intake, through the heatsink and out into the exhaust area.

It should be noted that this example would also work with a reversed air flow, whereby air can be caused to pass firstly through the duct and then over the unducted components. This can be advantageous where there is or are one or more heat sensitive components over which it is desired to pass cool intake air before it becomes warmed by passing over other components that generate heat.

Figure 2:
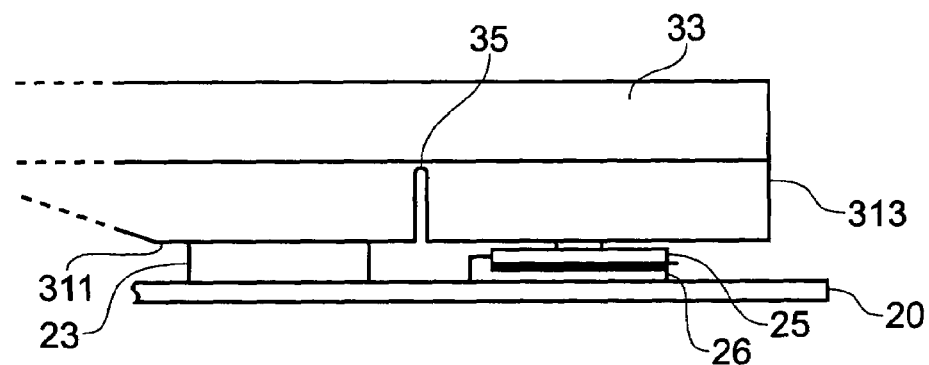
FIG. 2 shows a schematic side view of a part of a heatsink arrangement of the example of FIG. 1.

With reference to FIG. 2, the way in which the heatsink and duct assembly 31, 41 provides cooling to the components 23 and 25 will now be described.

FIG. 2 shows a side view of the components 23 and 25 mounted on a circuit board 20 (which was not shown in FIG. 1). In the present example the component 23 is a so-called surface-mount device and is mounted directly onto the circuit board 20. On the other hand, the component 25 is mounted into a socket 26, which is in turn mounted onto the circuit board 20.

Each of the components 23 and 25, in use, produces heat as a result of the electrical current passing through the circuits within the component. Each of the components 23 and 25 has a maximum operating temperature. This maximum operating temperature is the safe maximum limit for successful operation of the component. Causing or allowing the component to become hotter than the maximum operating temperature may cause unstable behavior of the component or complete failure of the component. Some computer system components do not require any assistance in remaining below the maximum operating temperature, however some components do require such assistance. For this reason, it is necessary to provide cooling to the latter class of components, which in the present example are represented by components 23 and 25.

What is more, the two components may very likely have different maximum operating temperatures. Thus if a single totally unitary heatsink were to be used to cool both components, both components would have to be cooled to the lowest maximum operating temperature possessed by any of the components. This situation could result in one component being substantially overcooled such that more cooling effort than is strictly necessary being used. In the present example, this situation is addressed by the thermal barrier 35.

Thermal barrier 35 provides a temperature gradient interruption between the portion 311 of the heatsink cooling component 23 and the portion 313 of the heatsink cooling component 25. In the example of FIG. 2, the thermal barrier 35 comprises a substantial reduction in cross-sectional area of the heatsink caused by reducing the thickness of the heatsink. Thus the two portions 311 and 313 of the heatsink 31 have reduced thermal conductivity between them relative to the thermal conductivity across each portion taken in isolation.

By means of the thermal barrier 35 the cooling capacities of the two heatsink portions 311 and 312 may be set according to the thermal properties of the components 23 and 25. To ensure continued heat dissipation by the heatsink portions 311 and 313, the flow of air between the fins 33 is maintained by the fan 45. The fins 33 can optionally also be provided with a thermal barrier corresponding to the thermal barrier 35 in the heatsink body. Providing suitable thermal barriers in the fins can reduce the transfer of heat across the barrier in the heatsink body. Such thermal barriers in the fins may comprise a gap in each or some fins corresponding to the thermal barrier in the heatsink body. Alternatively, the fins may have gaps as described above, wherein the gaps are filled with a material having a low thermal conductivity such as a plastic resin or ceramic.

Thus there has now been described an example of a cooling arrangement using a single heatsink and labyrinthine duct arrangement to cool two distinct components within a computer system module. This provides advantages of enhanced cooling capability for specific high temperature components (more than two may be cooled by a single heatsink and duct arrangement—as will be appreciated by the skilled addressee) and control of cooling airflow around the module.

Figure 3:
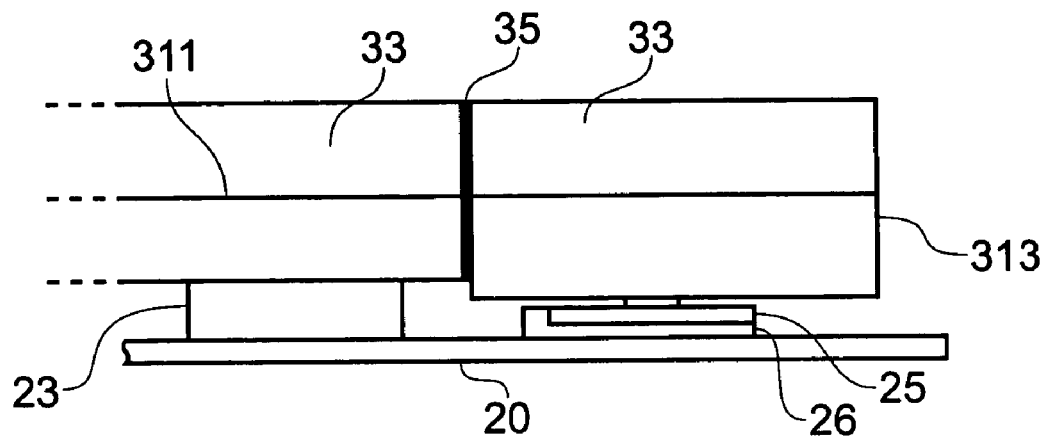
FIG. 3 shows a schematic side view of a part of an alternative heatsink arrangement of the example of FIG. 1.

With reference to FIG. 3, an alternative heatsink thermal barrier arrangement will now be described.

FIG. 3 shows a schematic side view of a part of an alternative heatsink arrangement of the example of FIG. 1. In this example, the two heatsink portions 311 and 313 are attached to the components 23 and 25 as described above. However in the present example, the thermal barrier between the two portions 311 and 313 is provided by a layer of material having a low thermal conductivity. Examples of suitable materials include plastic resins, such as an epoxy resin, and ceramics with low thermal conductivity.

In the example of FIG. 3, the thermal barrier is extended to the fins 33, such that a complete thermal barrier is formed between the two portions 311 and 313 of the heatsink 31.

Figure 4:
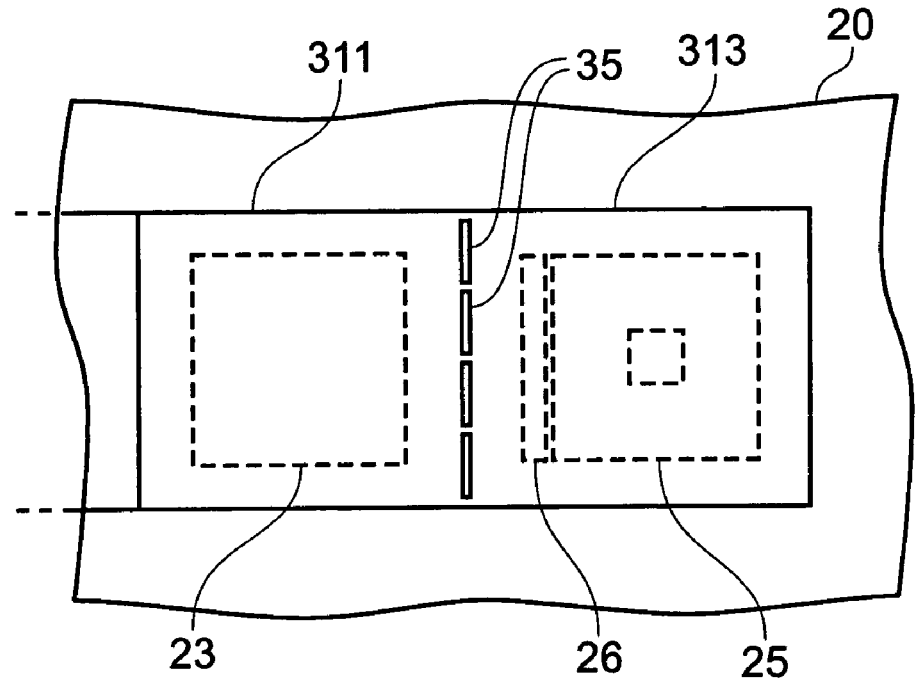
FIG. 4 shows a schematic plan view of a part of another alternative heatsink arrangement of the example of FIG. 1.

Another example of a thermal barrier arrangement is shown in FIG. 4.

FIG. 4 shows a schematic plan view of a part of another alternative heatsink arrangement of the example of FIG. 1. In this arrangement, the thermal barrier comprises a plurality of gaps within the heatsink 31 between the two portions 311 and 313. Each gap in the present example comprises a vertical slot through the heatsink, such that the two portions 311 and 313 are joined by a number of thin strips formed between the slots. Thus the cross-section of the heatsink is reduced at the thermal barrier.

Thus, there have now been described a plurality of different ways of creating a thermal barrier between different portions of the heatsink 31. The skilled addressee will appreciate that the disclosed examples represent just some of the possible ways of creating a suitable thermal barrier. Other possibilities include total physical isolation (thereby creating a complete thermal break) and alternative arrangements for reducing the cross-section of the heatsink, also gaps formed through or in the heatsink may be filled with low thermal conductivity materials such as plastic resins or ceramics.

Figure 5:
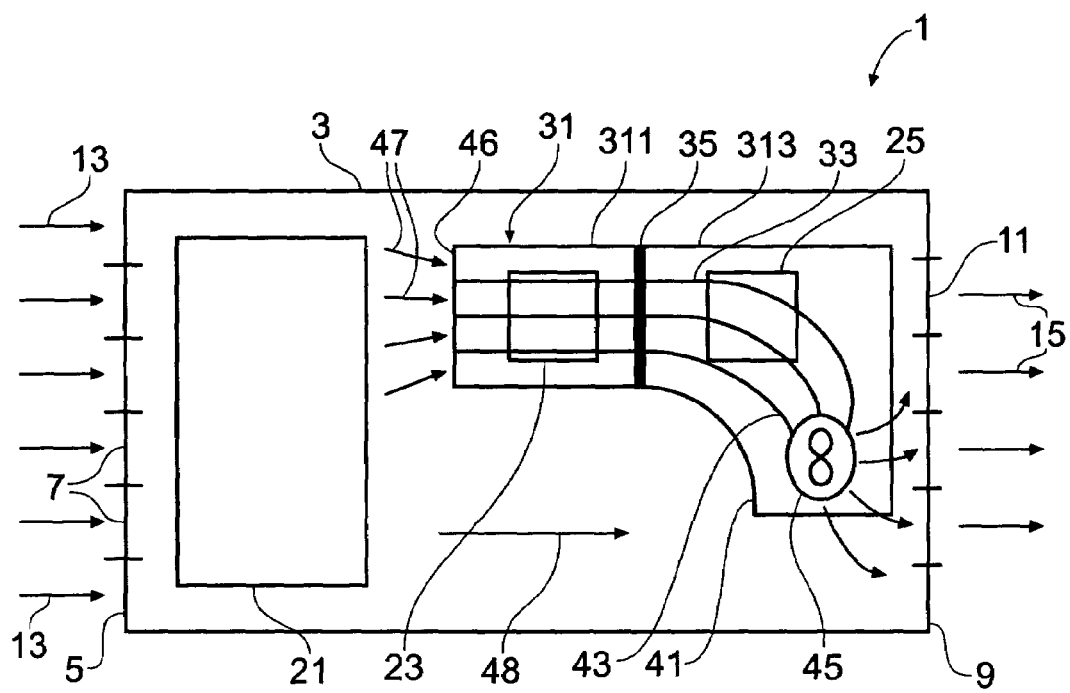
FIG. 5 shows a schematic cut-away plan view of a second example of an air-cooled computer system module.
Figure 6:
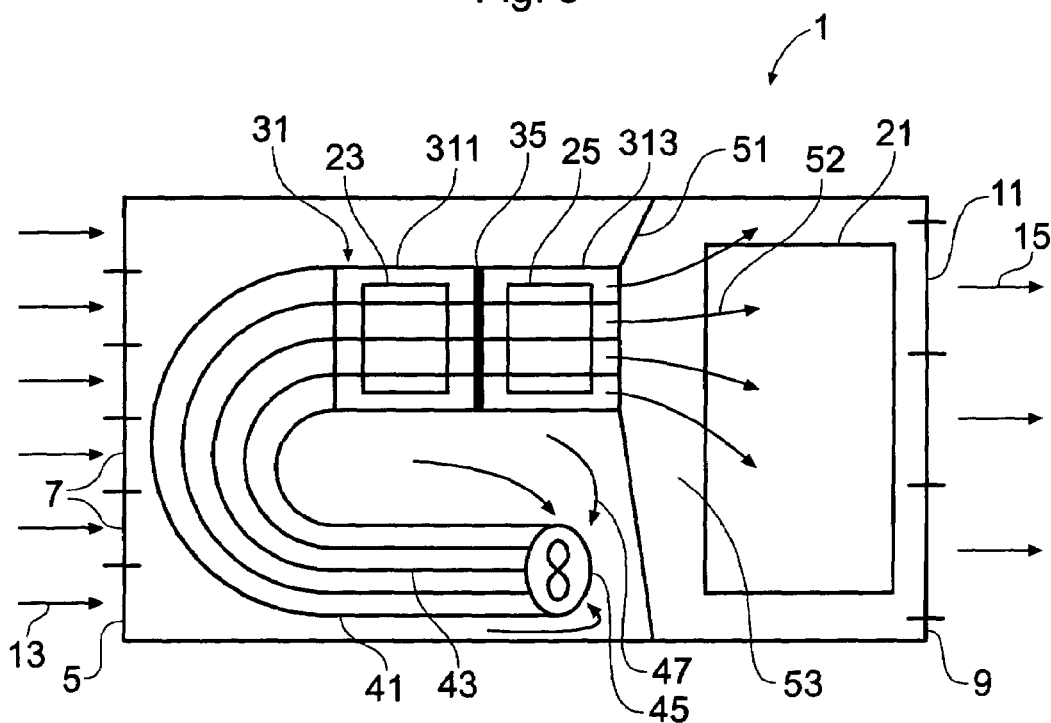
FIG. 6 shows a schematic cut-away plan view of a third example of an air-cooled computer system module.
Figure 7:
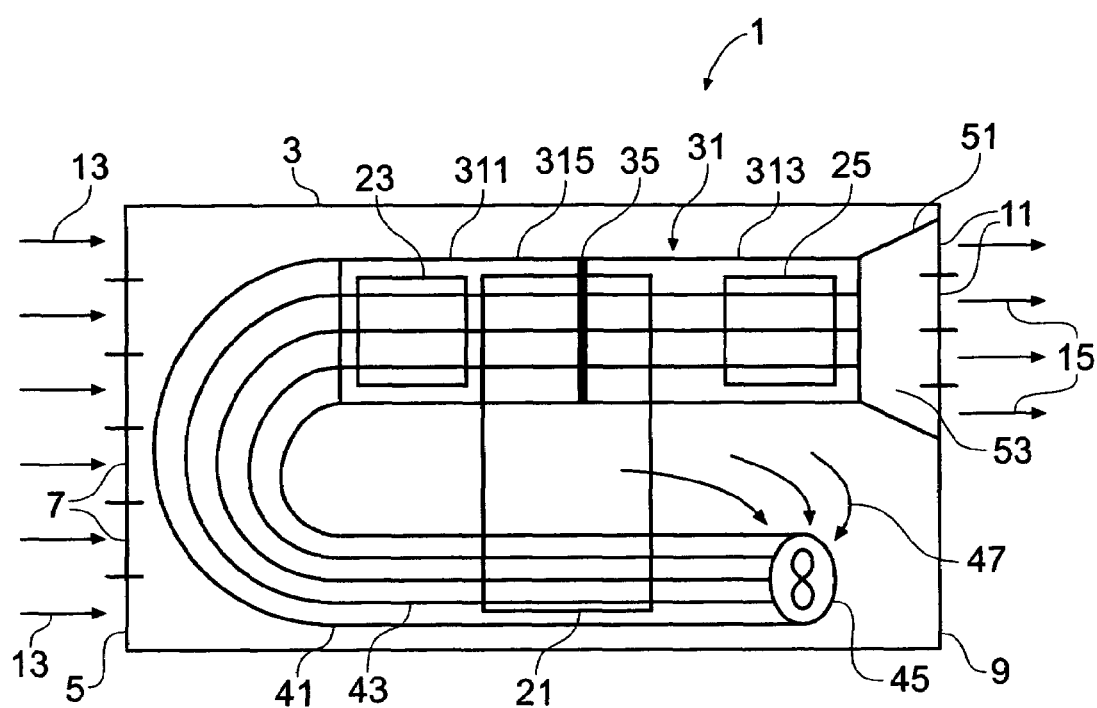
FIG. 7 shows a schematic cut-away plan view of a fourth example of an air-cooled computer system module.

With reference to FIGS. 5, 6 and 7, there will now be described a plurality of alternative arrangements for a heatsink and duct arrangement within a computer system module.

FIG. 5 shows a second example of an air cooled computer system module 1. As in the first example described with reference to FIG. 1 above, the module 1 comprises a housing 3 having a first face 5 which has inlet vents 7 formed therethrough and a second face 9 which has outlet vents 9 formed therethrough. The components 21, 23 and 25 are present within the housing 3, with the components 23 and 25 having a heatsink 31 mounted thereon.

In the present example, cooling air enters the housing 3 through the inlet vents 7 as indicated by arrows 13. This air then flows over component 21 before following one of two flow paths. Some of the cooling airflow follows the path indicated by arrow 48, bypassing the heatsink 31 and flowing directly toward the second face 9 before exiting the housing through outlet vents 11 as indicated by arrows 15. The remainder of the cooling airflow enters the heatsink 31 at an intake 46 as indicated by arrows 47. In the present example, no fan is mounted in the intake. The air entering the intake 46 flows through the heatsink 31, passing between the fins 33 and passing over the two portions 311 and 313 of the heatsink 31 which are attached to components 23 and 25 respectively. As in the first example, the two portions 311 and 313 are divided by a thermal barrier.

Air flowing through the heatsink 31 passes into a duct 41 and flows between fins 43 of the duct, which follow continuously on from the fins 33 of the heatsink 31. The fins 43 guide the airflow to a fan 45 which is located at the exhaust from the duct 41. Air leaving the duct 41 through the exhaust then flows out of the housing 3 via the outlet vents 11 in the second face 9 as indicated by arrows 15.

The arrangement of this second example differs from the first example in that not all of the cooling air flowing into the housing has to flow through the heatsink before exiting the housing. Also, the duct is smaller than in the first example and so provides less heat-sinking potential than the duct of the first example. Thus the total cooling efficiency provided by this second example could be less than that provided by the first example, but would still provide considerable benefit in situations requiring high capacity efficient cooling but to a slightly lower standard than that provided by the arrangement of the first example.

An advantage of the second example is that external air movers (e.g., fans) can be used to provide most of the cooling in the main system cavity, whereby internal air movers (e.g., the fan 45) do not become bottlenecks to system air flow.

FIG. 6 shows a third example of an air cooled computer system module 1. In this example the order in which the cooling airflow reaches the components is altered relative to the first and second examples.

As in the first and second examples, the computer system module 1 has a housing 3 which houses the components of the module. The housing 3 has a first face 5 having inlet vents 7 therethrough and a second face 9 having outlet vents 11 therethrough. In the present example, the components 23 and 25, the heatsink 31 and the duct 41 are arranged in a similar fashion to the arrangement of the first example. However, in the present example, the disk drive 21 is located toward the second face 9 of the housing 3, i.e. "downstream" of the heatsink 31 in terms of cooling airflow. Thus the exhaust area 53 is much enlarged relative to that of the first example and it now contains the component 21 and may also contain various other components of the module (not shown).

The airflow situation in the present example is that cooling airflow enters the housing 3 through the inlet vents 7 (arrows 13) and flows over and around any components (not shown) located between the first face 5 and the duct intake. The air then flows into the duct intake (arrows 47) under the influence of fan 45 and along the duct 41. Guided by the fins 43, the air flows across the heatsink 31, between the fins 33. Thus the air flows across the first and second portions 311 and 313 of the heatsink 31 as divided by the thermal barrier 35. The air then flow out from the heatsink into the exhaust area 53 (arrows 52), which is divided off from the rest of the housing by divider members 51. The air then flows over and around the component 21 and any other components (not shown) mounted in the exhaust area before flowing out of the housing through the outlet vents 11 (arrows 15).

In this third example, the full rear face of the system can be used to minimize flow resistance, particularly where it is difficult to wrap an effective duct around typically rear face features such as connectors, joints, etc.

FIG. 7 shows a fourth example of an air cooled computer system module 1. In this example another different possible configuration of the components, heatsink and duct within the housing is shown.

In this example, the arrangement of the components, heatsink and duct is similar to that shown in the first example above. However, in the present example, the two components 23 and 25 which are to receive cooling from the heatsink 31 are mounted at a relatively large distance from one another within the housing 3. In fact, the disk drive 21 is mounted in the housing between the two components 23 and 25. Therefore in the present example, the heatsink 31 extends across the disk drive 21 in order to provide cooling to both of the components 23 and 25.

To avoid causing cooling complications for the disk drive 21, there is no physical contact between the disk drive 21 and the heatsink 31. If necessary (depending upon the exact physical dimensions of the heatsink 31 and the disk drive 21, the part of the heatsink 31 which passes over the disk drive 21 may be formed more as a duct having a smaller cross-sectional area than the portions of the heatsink which contact the components 23 and 25.

Thus the flow of cooling air through the housing 3 follows a route of entering the housing through the inlet vents 7 (arrows 13), flowing over and around components of the module including the disk drive 21 to enter the duct 41 under the influence in intake fan 45 (arrows 47). The air then flows along the duct 41, guided by the labyrinthine arrangement of fins 43 to pass over the heatsink 31 between the fins 33. The air flows first over the portion 311 of the heatsink which provides cooling to component 23 and then through the bridging portion 315 which spans the disk drive 21 and then over the portion 313 which provides cooling to the component 25. As in the above examples, the portions 311 and 313 are divided thermally by a thermal barrier 35. Finally the air flows out from the heatsink 31 into an exhaust area 53 which is bounded from the rest of the housing by divider member 51 and then out of the housing through outlet vents 11 (arrows 15).

Thus the present example shows how the heatsink 31 may be arranged to provide cooling to components which are separated from one another and which have other components to which the heatsink does not attach located between them.

Thus there have now been described a plurality of examples of a multi-thermal-zone heatsink and duct assembly suitable for use in providing cooling to a plurality of computer system components. A plurality of methods for dividing the heatsink into multiple thermal zones have also been described. Many modifications and alterations may be made to the above described examples and equivalents to the described components may be substituted without departing from the scope of the present invention. Examples of some possible modifications are described hereafter.

Although it has been described above that the cooling system is provided within a computer system module, the cooling system described in the above examples may, as the skilled reader will appreciate, also be employed within a unitary or non-modular computer system.

Although it has been described above with reference to FIGS. 1, 5, 6 and 7 that the inlet and outlet valves are on opposing faces of the housing, this is not essential and any combination of faces may be used, including using different areas of the same face for both inlet and outlet valves. Further or in addition, the inlet valves and/or the outlet valves may be formed through less than a whole face, a whole face, more than a whole face or less than all of more than one face. The skilled will recognize the possibilities provided by these many arrangements of inlet and outlet valves and will be able to use these or other arrangements of inlet and outlet valves without any inventive input.

Although it has been described above with reference to FIGS. 1 to 7 that the heatsink is arranged to provide cooling to two distinct computer system components, that case is not limiting. The heatsink arrangement may be extended to cover as many or as few components requiring cooling as is desired. More than one component may be cooled by each thermal zone of the heatsink. Further, the heatsink may comprise more than two distinct thermal zones and the thermal barriers between the thermal zones may all be of the same construction for a given heatsink, or different thermal barrier constructions may be used on a single heatsink. For example, a heatsink which is to cool one component having a maximum operating temperature of 85° C., one component having a maximum operating temperature of 60° C., and one component having a maximum operating temperature of 65° C. may be divided into three thermal zones by two thermal barriers, one thermal zone corresponding to each component to be cooled. The thermal barrier between the zone for the 85° C. and the zone for the 60° C. may be required to provide a greater degree of thermal separation than the barrier between the zone for the 60° C. and the zone for the 65° C. Thus the barrier requiring a high degree of thermal separation may be formed by a thick layer of epoxy resin whereas the barrier requiring a lower degree of thermal separation may be formed by a slight reduction in the cross section of the heatsink.

What is claimed is:

1. Computing apparatus having:
   first and second computing elements;
   a heatsink thermally coupled to each of the first and second computing elements, wherein a portion of the heatsink thermally coupled to the first computing element is thermally separated from a portion of the heatsink thermally coupled to the second computing element by a region having a reduced thermal conductivity; and
   a duct extending from an inlet located remote the heatsink to one portion of the heatsink.

2. The apparatus of claim 1, wherein the region having a reduced thermal conductivity comprises a thermal barrier.

3. The apparatus of claim 1, wherein the region having a reduced thermal conductivity comprises a thermal break.

4. The apparatus of claim 1, wherein the duct and the heatsink each comprise respective fins arranged to direct a flow of cooling air through the duct and across the heatsink portions.

5. The apparatus of claim 1, wherein the duct acts as an extension of one of the portions of the heatsink.

6. The apparatus of claim 1, wherein a fan is provided for causing a flow of cooling air to pass through the duct and over the heatsink.

7. The apparatus of claim 1, further comprising a third computing element, wherein the heatsink comprises a portion thermally coupled to the third computing element, the portion of the heatsink thermally coupled to the third computing element being thermally separated from the other portions of the heatsink by a region having a reduced thermal conductivity.

8. The apparatus of claim 1, further comprising at least one computing element not thermally coupled to the heatsink.

9. The apparatus of claim 1, wherein at least one of the first and second computing elements is a central processing unit.

10. The apparatus of claim 1, wherein one of said first and second computing elements is a controller integrated circuit associated with a central processing unit.

11. The apparatus of claim 1, wherein each of the first and second computing elements have different physical dimensions and the respective portions of the heatsink are arranged to permit the heatsink to contact both computing elements simultaneously.

12. Computing apparatus including a housing that defines a cavity, the computer apparatus further including within the cavity multiple computing elements and a fan for generating airflow to cool said computing elements, said fan having a first path defining an air inflow and a second path defining an air outflow, wherein one of said first and second paths is ducted to a vent facility in a first wall of said housing, and the other one of said first and second paths communicates with said cavity adjacent said first wall, wherein at least two computing elements which are primary heat sources within the cavity are positioned in said first path or said second path and wherein a heatsink is attached to said at least two computing elements and wherein the heatsink is positioned in said first path or said second path, wherein the heatsink comprises a region of reduced thermal conductivity between a portion which is attached to a first one of the at least two computing elements and a portion which is attached to a second one of the at least two computing elements.

13. The apparatus of claim 12, wherein the region of reduced thermal conductivity comprises a thermal break.

14. Computing apparatus having:
    first and second computing elements;
    a heatsink thermally coupled to each of the first and second computing elements, wherein a portion of the heatsink thermally coupled to the first computing element is thermally separated from a portion of the heatsink thermally coupled to the second computing element by a region having a reduced thermal conductivity; and
    a housing that defines a cavity, the computing elements and the heatsink being located within the cavity, the housing further comprising an inlet and an outlet for permitting a flow of cooling air to pass through the cavity.

15. The apparatus of claim 14, comprising means for causing all of the flow of cooling air through the housing to flow across the heatsink.

16. The apparatus of claim 14, comprising a fan for driving a flow of cooling air through the cavity.

17. The apparatus of claim 14, wherein the region having a reduced thermal conductivity comprises a thermal barrier.

18. The apparatus of claim 14, wherein the region having a reduced thermal conductivity comprises a thermal break.

19. The apparatus of claim 14, further comprising a third computing element, wherein the heatsink comprises a portion thermally coupled to the third computing element, the portion of the heatsink thermally coupled to the third computing element being thermally separated from the other portions of the heatsink by a region having a reduced thermal conductivity.

* * * * *